United States Patent
Jalali (12)

(10) Patent No.: US 6,421,333 B1
(45) Date of Patent: Jul. 16, 2002

(54) CHANNEL CODING AND INTERLEAVING FOR TRANSMISSION ON A MULTICARRIER SYSTEM

(75) Inventor: Ahmad Jalali, Plano, TX (US)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 08/954,686

(22) Filed: Oct. 20, 1997

Related U.S. Application Data

(60) Provisional application No. 60/050,986, filed on Jun. 21, 1997.

(51) Int. Cl.[7] ............................................. H04B 7/216
(52) U.S. Cl. ........................ 370/342; 370/209; 370/335; 375/260
(58) Field of Search ................................ 370/203, 208, 370/209, 335, 342; 375/200, 260

(56) References Cited

U.S. PATENT DOCUMENTS

| | | | | |
|---|---|---|---|---|
| 4,881,241 A | * | 11/1989 | Pommier et al. | 375/260 |
| 5,177,767 A | * | 1/1993 | Kato | 375/200 |
| 5,278,826 A | * | 1/1994 | Murphy et al. | 370/343 |
| 5,283,780 A | * | 2/1994 | Schuchman et al. | 370/312 |
| 5,442,627 A | * | 8/1995 | Viterbi et al. | 370/209 |
| 5,521,937 A | * | 5/1996 | Kondo et al. | 375/206 |
| 5,596,604 A | | 1/1997 | Cioffi et al. | 345/260 |
| 5,822,359 A | * | 10/1998 | Bruckert et al. | 375/200 |
| 5,881,093 A | * | 3/1999 | Wang et al. | 275/200 |
| 5,896,374 A | * | 4/1999 | Okumura et al. | 370/311 |
| 5,930,230 A | * | 7/1999 | Odenwalder et al. | 370/208 |

FOREIGN PATENT DOCUMENTS

| | | |
|---|---|---|
| EP | 0758167 A1 | 2/1997 |
| WO | WO96/24196 | 8/1996 |

\* cited by examiner

*Primary Examiner*—Hassan Kizou
*Assistant Examiner*—Saba Tsegaye
(74) *Attorney, Agent, or Firm*—Haynes and Boone, LLP

(57) ABSTRACT

A system and method that codes and interleaves data onto separate channels for transmission in a wireless multicarrier system. The multicarrier wireless transmission system has an input terminal for receiving a plurality of user data bits. The system adds error-correcting bits to the user data bits. The system then arranges and stores the combination of error-correcting bits, collectively coded symbols, in a two dimensional matrix. The system arranges the coded symbols by writing them into the matrix according to columns, from left to right. The system then retrieves the symbols from the matrix according to rows, from top to bottom. The system then transmits the retrieved symbols on different carrier frequencies such that consecutive symbols are each transmitted on a different carrier frequency.

13 Claims, 2 Drawing Sheets

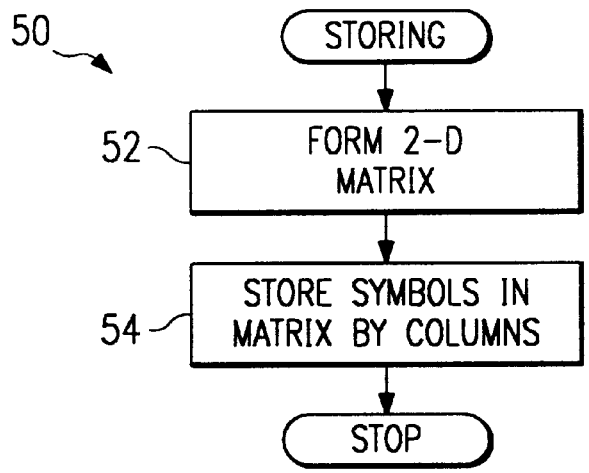
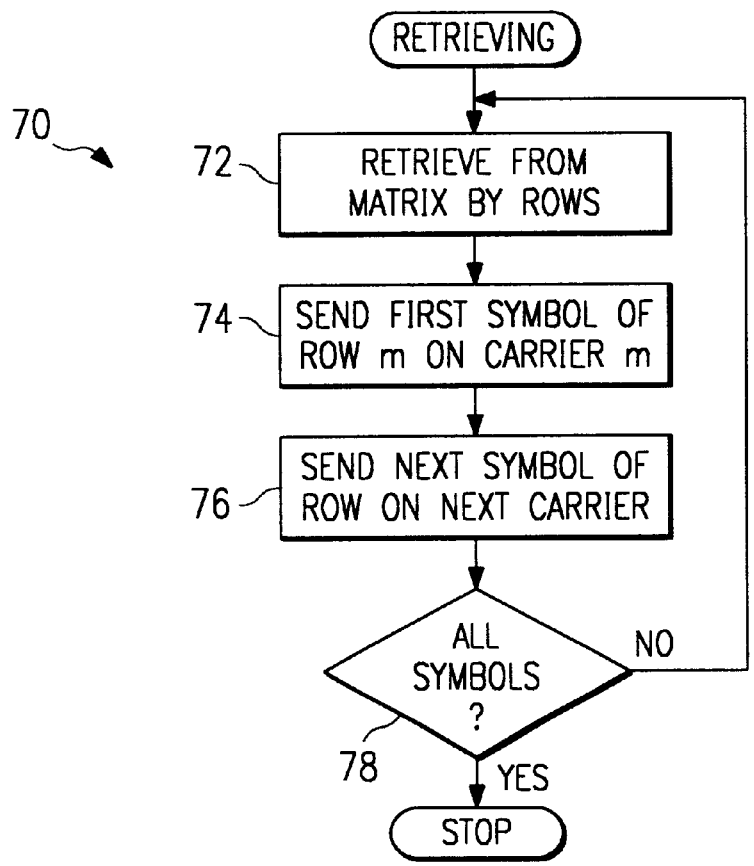

CHANNEL CODING AND INTERLEAVING FOR TRANSMISSION ON A MULTICARRIER SYSTEM

This application claims the benefit of U.S. Provisional Application No. 60/050,986, filed on Jun. 21, 1997.

TECHNICAL FIELD

The invention relates generally to transmitting and receiving data in a telecommunication system and, more particularly, to a system and method for coding and interleaving data onto separate channels for transmission in a multicarrier system.

BACKGROUND OF THE INVENTION

Generally, a wireless telecommunication system serves a defined area by dividing the area into cells. Each cell is served by a single base station, or cell site, and each cell site is connected to a message switching center ("MSC") via appropriate hardware links. A mobile unit is connected to the MSC by establishing a link with a nearby cell site using one or more radio frequency ("RF") channels, or carriers.

For various reasons, higher data rates are desirable in the RF link between the mobile unit and the cell site. For example, in a code division multiple access ("CDMA") system, data rates are somewhat restricted due to current standards that require a system bandwidth of 1.25 Megahertz (MHz). However, future requirements are expanding to support a system bandwidth of n×1.25 MHz, where n is an integer, thereby supporting backwards compatibility to the traditional 1.25 MHz bandwidth.

Once a system bandwidth of n×1.25 MHz is chosen, there are two conventional methods by which the data may be transmitted over the chosen bandwidth. One method, referred to as direct spread, encodes the data using a convolutional code, interleaves the resulting coded bit stream, encodes the interleaved symbols using a Walsh code unique to the user, further encodes the encoded symbols using a pseudo-noise (PN) code, and then transmits the resulting symbols, known as chips, on the entire n×1.25 MHz bandwidth. Using this method, the actual symbol rate on the RF carrier is n×1.25 million chips per second. Another method, referred to as multicarrier, splits the encoded data into n streams, encodes each stream using a Walsh and a PN code, and then transmits the resulting chips of each stream on a separate 1.25 MHz carrier. A CDMA compatibility standard for cellular mobile telecommunications systems, including greater detail in the above described methods, is described in MOBILE STATION-BASE STATION COMPATIBILITY STANDARD FOR DUAL-MODE WIDEBAND SPREAD SPECTRUM CELLULAR SYSTEM, TIA/EIA/IS-95 (July 1993).

The multicarrier method described above does not adequately handle error conditions that occur over the separate carriers. For example, if several bit errors occur in sequential order, even the existence of error correcting code in the bit stream does not prevent certain data bits from being lost. To alleviate this problem, the multicarrier method interleaves, or shuffles, the order of the data bits separately on each carrier before transmission and then de-interleaves the data bits at the receiving end. This solution, however, has several deficiencies. For one, shuffling circuits are often used for each carrier, thereby requiring extra circuitry. Also, the shuffling does not take into account that certain carrier frequencies may be more robust at any particular time, and therefore subject to less errors than the other carrier frequencies.

Therefore, what is needed is a system and method that codes and interleaves data onto separate carriers for transmission in a multicarrier system.

Furthermore, what is needed is a system and method that does not require individual interleaving circuitry for each carrier of the multicarrier system.

Furthermore, what is needed is a system and method that utilizes a different carrier for consecutive bits of the error correcting code, thereby providing a versatile system that is less prone to errors.

SUMMARY OF THE INVENTION

The foregoing problems are solved and a technical advance is achieved by a system and method that codes and interleaves data onto separate channels for transmission in a telecommunication system. In one embodiment, the multicarrier telecommunication system has an input terminal for receiving a plurality of user data bits. The system may add error-correcting bits to the user data bits. The system then arranges and stores the combination of error-correcting bits, collectively coded symbols, in a two dimensional matrix. The system arranges the symbols by writing them into the matrix according to columns, from left to right. The system then retrieves the symbols from the matrix according to rows, from top to bottom and transmits the retrieved symbols on different carrier frequencies such that consecutive symbols are each transmitted on a different carrier frequency.

As a result, the system reduces the effect of errors resulting from any single carrier. Furthermore, the arranging of the symbols is performed at a central location, thereby obviating a need for each carrier to have its own shuffling device.

BRIEF DESCRIPTION OF THE DRAWING

FIG. 2 is a flow chart for a routine used to store symbols received by the base station of FIG. 1 into a matrix.

FIG. 3 is a flow chart for a routine to retrieve the symbols stored in the matrix of FIG. 2 for transmission.

DESCRIPTION OF THE PREFERRED EMBODIMENT

Figure 1:
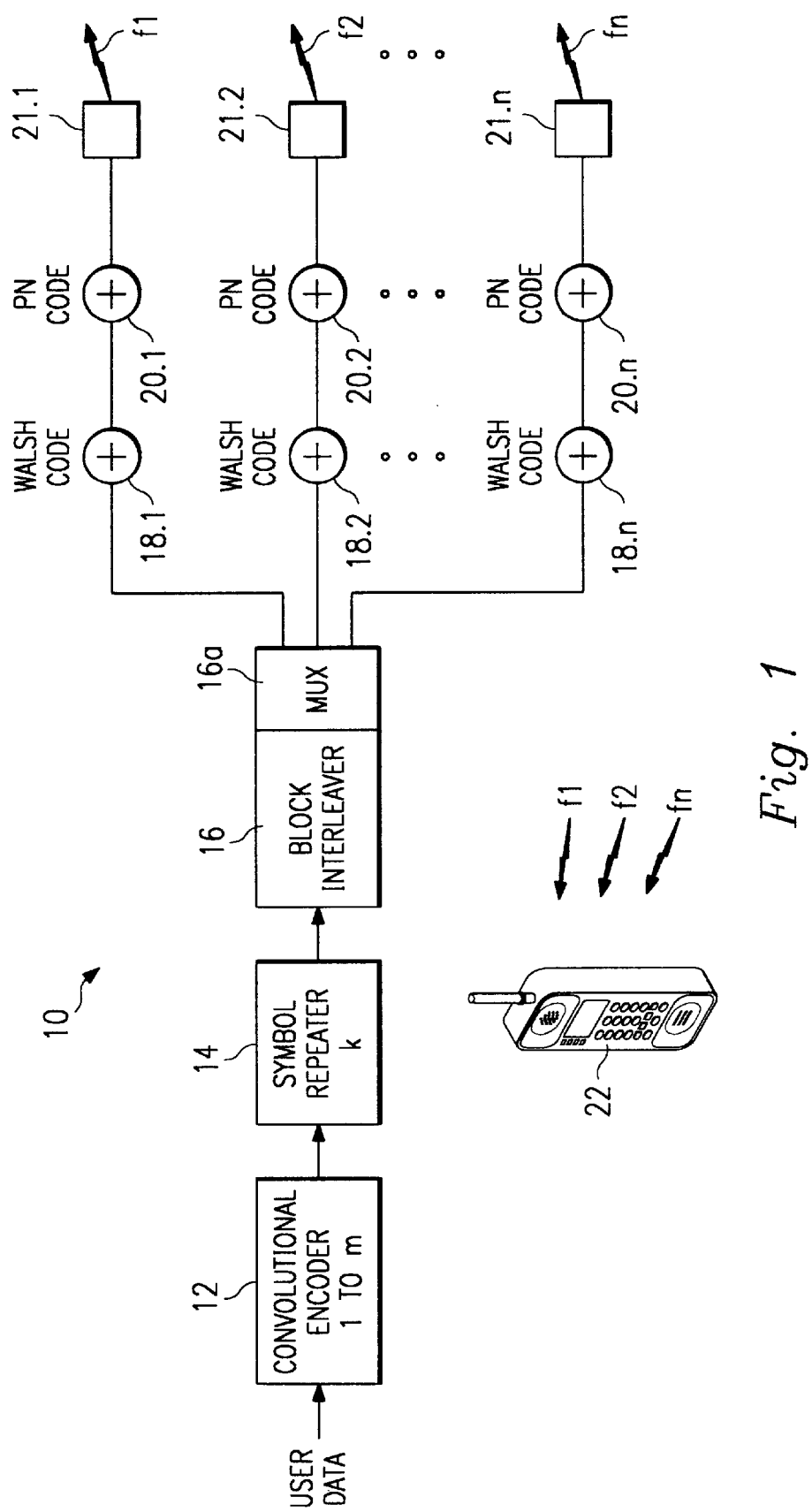
FIG. 1 is a block diagram of a base station and mobile unit in a multicarrier CDMA system.

Referring to FIG. 1, the reference numeral 10 designates a simplified base station of a multicarrier CDMA system. The base station 10 includes a convolutional encoder 12 (with a rate 1/m), a symbol repeater (k times) 14, and a block interleaver 16 having an inverse-multiplexer 16a. The base station 10 utilizes multiple (n.) carriers on separate frequencies f1–fn, each with a bandwidth of 1.25 MHz and each adding a conventional Walsh code 18.1–18.$n$ and PN code 20.1–20.$n$ before being processed (baseband filtering, upconversion, amplification) and transmitted by devices 21.1–21.$n$, respectively. For the sake of example, only the forward link from base station 10 to a mobile unit 22 will be discussed, where a frame of r user data bits is received by the base station and a symbol stream divided of m×k×r size blocks is transmitted.

When each bit of the user data enters the convolutional encoder 12, it is encoded into m symbols. The encoded symbols are then provided to the symbol repeater 14 where each symbol is repeated k times. The convolutional encoder 12 and the symbol repeater 14 are conventional devices for providing error-correcting capability, and for the sake of brevity, will not be further discussed.

Referring to FIG. 2, a method 50 is used to interleave the symbol stream produced from the symbol repetition block 14. At step 52, the block interleaver 16 forms a matrix of m×k×q rows by p columns, where q and p are positive integers and $$p \times q = r. \qquad (1)$$

At step 54, the block interleaver 16 writes the encoded symbols into the matrix starting at the top of the first column and continuing down to the bottom of the first column. Once the first column is written, the symbols are filled into the second column from top to bottom. Step 54 is continued until all columns of the matrix are filled.

Referring to FIG. 3, once the matrix has been filled, a routine 70 is used to retrieve the symbols from the matrix for transmission on the different carriers f1–fn. At step 72, the inverse-multiplexer 16a retrieves the first symbol on the first row and at step 74, sends the first symbol to the device 21.1 to be transmitted on carrier f1. At step 76, the inverse-multiplexer then sends the following symbols on the first row sequentially to be transmitted on carriers f2 through fn, one on each carrier until a symbol is transmitted on each of the n carriers. This step is then repeated with the next n symbols on the first row until all symbols of the first row are transmitted. At step 78, a determination is made as to whether any more rows are available. If not, execution stops. Otherwise, execution returns to step 72 where the inverse-multiplexer 16a retrieves the first symbol of the second row and at step 74, sends this symbol to the device 21.2 to be transmitted on the carrier f2. The inverse-multiplexer then sends the following symbols on the second row to be transmitted on carriers f3, f4, . . . , f1 until n symbols are transmitted on each of the n carriers. This step is then repeated with the next n symbols on the second row until all symbols of the second row are transmitted. If more rows remain, the inverse-multiplexer 16a returns to step 72, retrieves the first symbol of the third row on carrier f3, and sends the remaining symbols to be transmitted on carriers f4, f5, . . . , f4, and so forth. On row n+1, the inverse-multiplexer 16a sends the first symbol to be transmitted on carrier f1, and the steps 72–78 are repeated. Likewise, the transmission of rows n+2, n+n+2, n+n+n+2, etc., each start with carrier f2, and so forth for the remaining rows.

For the sake of example, a frame of 10 user data bits (r=10) is encoded using a 1-to-3 (m=3) rate convolutional code, repeated twice (k=2) and then divided between three different carrier signals (n=3). The resulting symbol stream is divided into blocks of 60 symbols, which are interleaved across time as well as the 3 carrier signals. A matrix, illustrated in Table 1, has twelve columns (q=2) and five rows (p=5). Each symbol of the matrix is represented as either $X_i$, $Y_i$ or $Z_i$ which together represent the three bits that are generated from one information bit by the convolutional encoder 12, where i is between 1 and 10. Furthermore, each of the symbols $X_i$, $Y_i$ and $Z_i$ are repeated twice by the symbol repeater 14. Using the method 50 described above, the symbols are written into the columns of the matrix as illustrated below.

TABLE 1

Interleaving Matrix

| $X_1$ | $Z_1$ | $Z_2$ | $Y_3$ | $Y_4$ | $X_5$ | $X_6$ | $Z_6$ | $Z_7$ | $Y_8$ | $Y_9$ | $X_{10}$ |
| $X_1$ | $X_2$ | $Z_2$ | $Z_3$ | $Y_4$ | $Y_5$ | $X_6$ | $X_7$ | $Z_7$ | $Z_8$ | $Y_9$ | $Y_{10}$ |
| $Y_1$ | $X_2$ | $X_3$ | $Z_3$ | $Z_4$ | $Y_5$ | $Y_6$ | $X_7$ | $X_8$ | $Z_8$ | $Z_9$ | $Y_{10}$ |

TABLE 1-continued

Interleaving Matrix

| $Y_1$ | $Y_2$ | $X_3$ | $X_4$ | $Z_4$ | $Z_5$ | $Y_6$ | $Y_7$ | $X_8$ | $X_9$ | $Z_9$ | $Z_{10}$ |
| $Z_1$ | $Y_2$ | $Y_3$ | $X_4$ | $X_5$ | $Z_5$ | $Z_6$ | $Y_7$ | $Y_8$ | $X_9$ | $X_{10}$ | $Z_{10}$ |

Once the symbols have been arranged in the matrix, the inverse-multiplexer 16a retrieves the symbols in an interleaved manner for transmission on the carriers f1, f2, and f3. Moving across each row of the matrix of Table 1 in sequential order, the inverse-multiplexer sends each symbol to be transmitted in the following sequence, as described in Table 2, below. In Table 2, the column "No." describes the sequence that each symbol is transmitted, the column "Symbol" corresponds to the name from Table 1, the column "(R,C)" identifies the row and column of Table 1 in which the symbol is stored, and the column "Freq." designates the carrier on which the symbol is transmitted.

TABLE 2

Transmission Sequence

| No. | Symbol | (R,C) | Freq. |
| --- | --- | --- | --- |
| 1 | $X_1$ | 1,1 | f1 |
| 2 | $Z_1$ | 1,2 | f2 |
| 3 | $Z_2$ | 1,3 | f3 |
| 4 | $Y_3$ | 1,4 | f1 |
| 5 | $Y_4$ | 1,5 | f2 |
| 6 | $X_5$ | 1,6 | f3 |
| 7 | $X_6$ | 1,7 | f1 |
| 8 | $Z_6$ | 1,8 | f2 |
| 9 | $Z_7$ | 1,9 | f3 |
| 10 | $Y_8$ | 1,10 | f1 |
| 11 | $Y_9$ | 1,11 | f2 |
| 12 | $X_{10}$ | 1,12 | f3 |
| 13 | $X_1$ | 2,1 | f2 |
| 14 | $X_2$ | 2,2 | f3 |
| 15 | $Z_2$ | 2,3 | f1 |
| 16 | $Z_3$ | 2,4 | f2 |
| 17 | $Y_4$ | 2,5 | f3 |
| 18 | $Y_5$ | 2,6 | f1 |
| 19 | $X_6$ | 2,7 | f2 |
| 20 | $X_7$ | 2,8 | f3 |
| 21 | $Z_7$ | 2,9 | f1 |
| 22 | $Z_8$ | 2,10 | f2 |
| 23 | $Y_9$ | 2,11 | f3 |
| 24 | $Y_{10}$ | 2,12 | f1 |
| 25 | $Y_1$ | 3,1 | f3 |
| ... | ... | ... | ... |
| 59 | $X_{10}$ | 5,11 | f2 |
| 60 | $Z_{10}$ | 5,12 | f3 |

It is understood that the mobile unit 22 has a similar broadcasting feature as described above for the base station 10. Furthermore, both the mobile unit 22 and the base station 10 also include receiver units for receiving and storing each symbol in a scheme opposite to the scheme described above, thereby allowing the data stream to be de-interleaved and fully restored.

In another embodiment, the block interleaver 16 may retrieve the symbol at the $j^{th}$ column and $i^{th}$ row of the matrix on carrier frequency $f_m$ such that:

$$m = (((j-1) \times r + i - 1) \mathrm{MOD} n) + 1, \qquad (2)$$

where r is the number of rows in the matrix, n is the number of carrier frequencies such that $1 \leq m \leq n$, and the function MOD signifies a modulus operation. By using equation (2) above, the interleaver 16 is ensured that no two consecutive coded symbols in the original coded sequence are transmitted on the same carrier frequency.

Therefore, although illustrative embodiments of the invention have been shown and described, other modifications, changes, and substitutions are intended in the foregoing disclosure. For example, the convolutional encoder 12 could be left out so that the symbol repeater 14 provides the only source of error correction capability. Also, Table 1 can be arranged according to rows, thereby allowing Table 2 to retrieve the symbols according to columns. Furthermore, the present invention is not limited to cell-based telecommunication systems, but instead may be used in many different types of systems, including wired-transmission systems. Accordingly, it is appropriate that the appended claims be construed broadly and in a manner consistent with the scope of the invention.

What is claimed is:

1. A telecommunication system comprising:

an input terminal for receiving a plurality of user data bits;

an error-correction device for generating a sequence of coded symbols from the user data bits;

an interleaver for arranging and storing the coded symbols in a matrix;

a plurality of transmitter devices for transmitting on a plurality of cariers;

an inverse-multiplexer for retrieving the coded symbols stored in the matrix by rows or columns and sequentially providing the retrieved coded symbols to the plurality of transmitter devices so that the retrieved coded symbols are sequentially transmitted using the plurality of carriers, except that upon reaching a first coded symbol of a next row or column, respectively, the sequential transmission will begin with one of the plurality of carriers other than the next carrier in the sequence.

2. The system of claim 1 further comprising a device for repeating the coded symbols.

3. The system of claim 1 wherein the error correction device is a repeater and the sequence of coded symbols include duplicates of the user data bits.

4. The system of claim 1 wherein each of the transmitters is a code division multiple access ("CDMA") transmitter.

5. The system of claim 1 wherein the error-correction device provides forward error correction.

6. The system of claim 1 wherein each carrier operates at a common bandwidth.

7. A method for arranging a frame of consecutive bits for transmission in a multicarrier system, the method comprising the steps of:

arranging and storing each bit of the frame in a two-dimensional matrix according to the first dimension of the matrix in columns or rows;

retrieving each bit stored in the matrix according to the second dimension to form an interleaved sequence of bits in rows or columns, respectively;

sequentially transmitting the interleaved sequence of bits on multiple carriers such that no two consecutively retrieved bits in the interleaved sequence of bits are transmitted on the same carrier and skipping a next carrier of the multiple carriers when changing rows or columns, respectively, so that no two consecutive bits of the frame are transmitted on the same carrier.

8. The method of claim 7 wherein the step of transmitting utilizes a code division multiple access ("CDMA") transmitter for each carrier of the multicarrier system.

9. The method of claim 7 wherein the frame of bits includes error-correcting code.

10. The method of claim 9 wherein the frame of bits also includes user data and the error-correcting code is a duplicate of the user data.

11. The method of claim 7 wherein each carrier of the multicarrier system operates at a common bandwidth.

12. A system for arranging a frame of consecutive bits for transmission in a multicarrier wireless system, the system comprising:

means for arranging and storing each bit of the frame in a two-dimensional matrix according to columns or rows of the matrix;

means for retrieving each bit stored in the matrix according to rows or columns, respectively, to form an interleaved sequence of bits; and a code division multiple access transmitter for transmitting the interleaved sequence of bits wherein the transmitter utilizes a sequence of carriers comprising multiple carriers operating at a common bandwidth and wherein no two consecutive bits of the frame are transmitted on the same carrier and bypassing a next carrier in the sequence of carriers when moving to the next row or column, respectively, so that no two consecutive bits in the interleaved sequence of bits are transmitted on the same carrier.

13. The system of claim 12 wherein the frame of bits includes error-correcting code.

* * * * *